United States Patent
Sankaran et al.

(10) Patent No.: US 10,523,175 B2
(45) Date of Patent: Dec. 31, 2019

(54) LOW LOSS GALVANIC ISOLATION CIRCUITRY

(71) Applicant: Texas Instruments Incorporated, Dallas, TX (US)

(72) Inventors: Swaminathan Sankaran, Allen, TX (US); Bradley Allen Kramer, Plano, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/466,961

(22) Filed: Mar. 23, 2017

(65) Prior Publication Data
US 2018/0278229 A1    Sep. 27, 2018

(51) Int. Cl.
- *H01P 5/02* (2006.01)
- *H03H 7/03* (2006.01)
- *H03H 7/01* (2006.01)
- *H03H 7/09* (2006.01)

(52) U.S. Cl.
CPC .......... *H03H 7/03* (2013.01); *H03H 7/0115* (2013.01); *H03H 7/0138* (2013.01)

(58) Field of Classification Search
CPC .................................. H01P 5/02; H03H 7/09
USPC .............................................. 333/24 R, 24 C
See application file for complete search history.

(56) References Cited

U.S. PATENT DOCUMENTS

| | | | | |
|---|---|---|---|---|
| 5,057,847 A | * | 10/1991 | Vaisanen | H01Q 1/1285 333/24 C |
| 5,321,597 A | * | 6/1994 | Alacoque | H02M 3/33584 363/124 |
| 5,557,290 A | * | 9/1996 | Watanabe | H01Q 1/1285 343/713 |
| 8,441,325 B2 | * | 5/2013 | Callahan | H01L 23/642 333/24 R |

(Continued)

FOREIGN PATENT DOCUMENTS

| | | |
|---|---|---|
| CA | 1082329 A | 7/1980 |
| CN | 201252551 Y | 6/2009 |

(Continued)

OTHER PUBLICATIONS

"ISO71xxCC 4242-Vpk Small-Footprint Low-Power Triple and Quad Channels Digital Isolators", Texas Instruments, SLLSE83F—Apr. 2013—Revised Jan. 2015, 35 pgs.

(Continued)

*Primary Examiner* — Dean O Takaoka
(74) *Attorney, Agent, or Firm* — Michael A. Davis, Jr.; Charles A. Brill; Frank D. Cimino (57) ABSTRACT

Disclosed examples include digital isolator modules, isolation circuitry and low-loss multi-order bandpass filter circuits, including a capacitive coupled galvanic isolation circuit with first and second coupling capacitors individually including a first plate and a second plate, and a bond wire connecting the first plates of the coupling capacitors, a first circuit with a first inductor coupled to form a first resonant tank circuit with a first parasitic capacitor associated with the second plate of the first coupling capacitor, and a second circuit with a second inductor coupled to form a second resonant tank circuit with a second parasitic capacitor associated with the second plate of the second coupling capacitor.

21 Claims, 10 Drawing Sheets

(56) References Cited

U.S. PATENT DOCUMENTS

| | | | |
|---|---|---|---|
| 9,450,650 B2 * | 9/2016 | Li | H01L 24/00 |
| 9,450,651 B2 * | 9/2016 | Subramoniam | H04B 5/0031 |
| 9,866,283 B2 * | 1/2018 | Subramonian | H04B 5/0087 |

FOREIGN PATENT DOCUMENTS

| | | |
|---|---|---|
| RU | 201018784 A | 3/2012 |
| RU | 2012130747 A | 2/2014 |

OTHER PUBLICATIONS

International Search Report for PCT/US2018/023733 dated Jul. 12, 2018; 2 pages.

* cited by examiner

LOW LOSS GALVANIC ISOLATION CIRCUITRY

BACKGROUND

Isolation is often desirable for interconnecting electrical systems to exchange data and power with one another. For example, two systems may be powered by different supply sources that do not share a common ground connection. Transformer isolation approaches involve magnetic fields, and the resulting electromagnetic interference (EMI) may be undesirable in certain applications. In addition, transformer isolation typically requires an external transformer component and these solutions require significant circuit or board area and are costly. Optical isolation avoids the EMI issues associated with transformer isolation. However, optical circuits are generally expensive and limited in speed. Capacitive coupling or AC coupling using series connected capacitors can be used to provide isolation for transmission of the data signal. However, capacitor-based isolation solutions often involve parasitic capacitance that absorbs signal energy and results in significant signal-path attenuation due to bottom-plate parasitic capacitance that shunts signal energy to a local ground. This leads to poor power efficiency, and large amounts of parasitic capacitance can severely limit bandwidth, leading to limitations on data rates and increased data latency. Moreover, these problems in capacitive coupled isolation devices that can lead to poor common mode performance.

SUMMARY

Disclosed examples include digital isolator modules, isolation circuitry and low-loss multi-order bandpass filter circuits, including a capacitive coupled isolation circuit with first and second coupling capacitors individually including a first plate and a second plate, and a bond wire connecting the first plates of the coupling capacitors. A first circuit with a first inductor is coupled to form a first resonant tank circuit with a first parasitic capacitor associated with the second plate of the first coupling capacitor, and a second circuit with a second inductor is coupled to form a second resonant tank circuit with a second parasitic capacitor associated with the second plate of the second coupling capacitor.

DETAILED DESCRIPTION

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." In addition, the terms "couple", "coupled" or "couples" are intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 1:
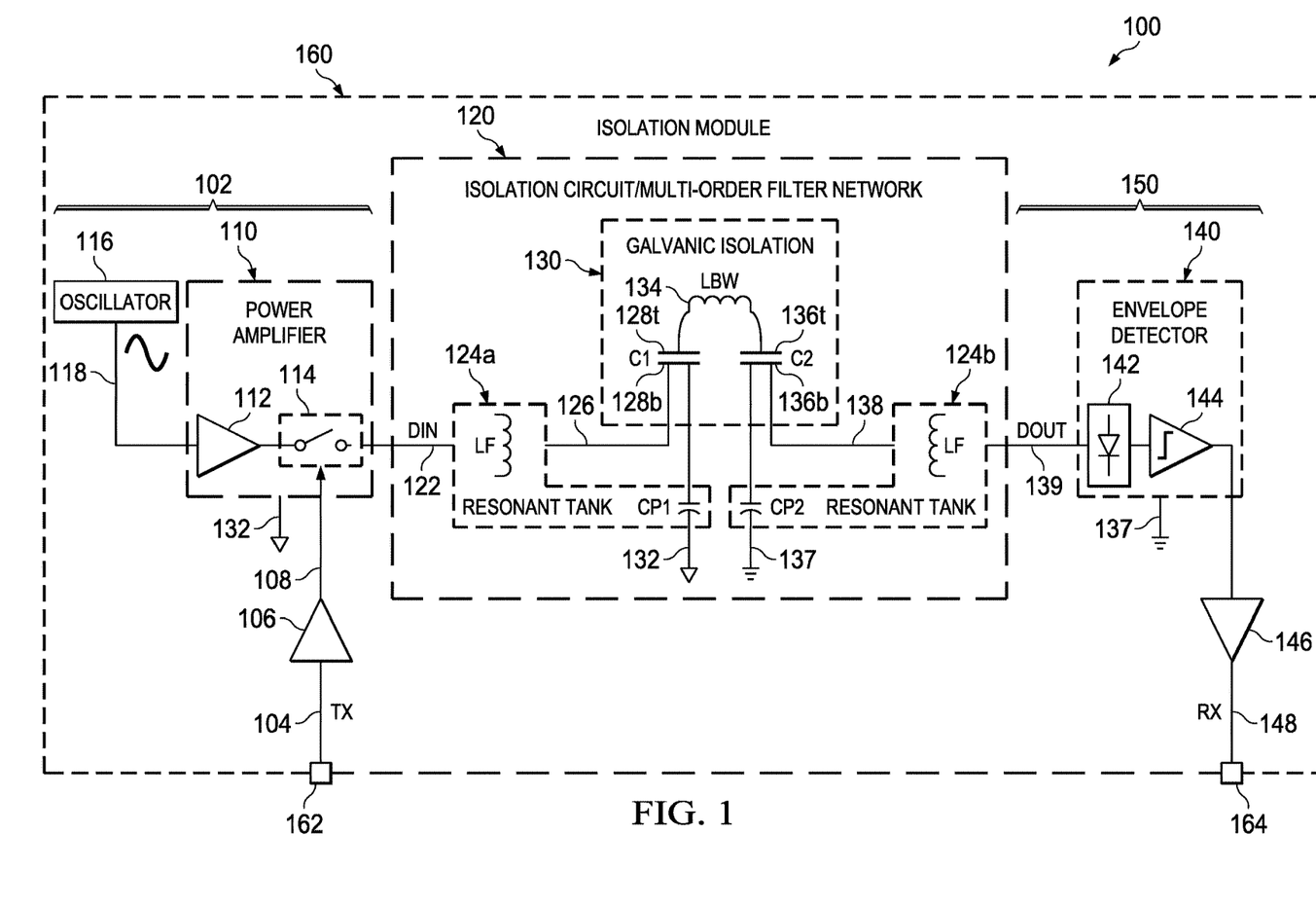
FIG. 1 is a schematic diagram of an isolation module with an isolation circuit providing a multi-order filter network according to an embodiment.

Referring initially to FIG. 1, disclosed examples provide capacitive coupled isolation circuitry 120, systems and filter circuitry. The examples include a capacitive coupled isolation circuit 130 with first and second coupling capacitors C1 and C2 connected by a bond wire 134, as well as first and second circuits 124a, 124b with an inductor LF to create resonant tank circuits with parasitic capacitors CP1 and CP2 associated with the coupling capacitors C1 and C2, respectively. The resulting isolation circuit 120 provides a bandpass or other multi-order filter network that can be employed in digital isolators or other isolation applications to convey a data signal across a galvanic isolation barrier. FIG. 1 illustrates an isolation system 100 including an example isolation module 160 with an input terminal 162 configured to receive a transmit input signal TX from an external signal source (not shown), and an output terminal 164 configured to provide or deliver a receive data signal RX to an external destination circuit (not shown). In practice, the external signal source and destination systems can be powered from separate power domains, for example, in an industrial setting. The isolation module 160 provides galvanic isolation to transmit digital data from the input terminal 162 to the output terminal 164 across an isolation barrier separating the two power domains. In the illustrated example, the isolation module 160 includes a transmit circuit 102 having an input 104 coupled with the input terminal 162 in order to receive the transmit signal TX. The module 160 also includes a receive circuit 150 with an output 148 coupled to the output terminal 164 to provide the receive signal RX. In operation, the isolation circuit 120 conveys an input data signal DIN from the transmit circuit 102 as a data output signal DOUT to the receive circuit 150 across a galvanic isolation barrier.

In the example of FIG. 1, the transmit circuit 102 is powered by a first domain having a first ground or constant voltage reference node 132, and the receive circuit 150 is separately powered relative to a second ground or constant voltage reference node 137. As shown in FIG. 1, the parasitic capacitor CP1 is electrically connected between the bottom plate 128b of the first coupling capacitor C1 and the first ground node 132, whereas the second parasitic capacitor CP2 is electrically connected between the bottom plate 136b of the second coupling capacitor C2 and the second ground node 137.

In the example isolation module 160 of FIG. 1, the transmit circuit 102 includes a buffer amplifier 106 receiving the TX signal from the input 104. The input buffer amplifier 106 can be any suitable single ended or differential amplifier circuit, and can provide electrostatic discharge (ESD) protection in certain embodiments. The buffer amplifier 106 includes an output 108 that provides a data signal to modulate a carrier signal in a transmit power amplifier circuit 110. The power amplifier circuit 110 in the illustrated example includes an amplifier circuit 112 and a switching circuit 114. The transmit circuit 102 further includes an oscillator 116 with an output 118 that provides a carrier signal to the power amplifier 110. In one implementation, the carrier signal is a high-frequency sinusoidal signal. The output of the amplifier 112 is modulated by the switch circuit 114 according to the data signal from the buffer amplifier 106 to provide the data input signal DIN to a first resonant tank input node 122 of the isolation circuit 120. In one example, the power amplifier circuit 110 provides the data input signal DIN as a sinusoidal signal with a first non-zero amplitude when the TX signal is a first binary state (e.g., high or "1") and the data input signal DIN has a fixed amplitude (e.g., 0 V) when the transmit signal TX is in a second binary state (e.g., low or "0").

The receive circuit 150 receives the data output signal DOUT from the isolation circuit 120 at a second resonant tank output node 139. In the illustrated example, the receive circuit 150 includes an envelope detector circuit 140 that includes a rectifier circuit 142 and a comparator circuit 144. In practice, a time varying signal DOUT is received, having non-zero voltage components or transients responsive to polarity changes in the data input signal DIN as a result of the AC coupling by the series-connected coupling capacitors C1 and C2. The rectifier circuit 142 rectifies the receipt voltage signal to create a DC voltage signal that is compared with a threshold by the comparator circuit 144. In this example, since the data input signal DIN has a non-zero amplitude for binary "1" transmit data and a zero amplitude for binary "0" transmit data, the output of the comparator 144 will be in a first binary state (e.g., high or "1") when the rectifier output signal exceeds the threshold voltage, and the output of the comparator 144 will be in a second binary state (e.g., low or "0") otherwise. The receive circuit 150 also includes an ESD protection/buffer circuit 146 that receives the output signal from the comparator 144 and provides the receive signal RX at the output node 148. In this manner, the isolation module provides the receive data signal RX corresponding to the received transmit signal TX, and the RX and TX signals are galvanically isolated from one another via the galvanic isolation circuit 130.

As previously noted, capacitive coupled isolation circuits typically suffer from reduced bandwidth, high data latency and/or poor common mode performance as a result of typically large parasitic capacitors CP1 and CP2 associated with the bottom or lower plates 128b, 136b of the wire bond coupled capacitors C1 and C2. In order to address these problems, disclosed examples advantageously provide first and second circuits 124 on either side of the galvanic isolation circuit 130 in order to create third or higher order filter networks through intelligent resonant tank circuit creation using the parasitic capacitors CP1 and CP2. In certain disclosed examples, the overall multi-order filter network provided by the isolation circuit 120 can be a bandpass filter. In certain examples, the first and second circuits 124a and 124b can be matched or substantially identical. In other embodiments, the circuits 124a and 124b can be different. Various implementations are possible in which the circuits 124 are designed to provide an overall multi-order filter network to accommodate transfer of the data signal DIN to create the data output signal DOUT to reliably transfer data from the source of the transmit data signal TX to the destination of the receive signal RX. The circuits 124 include an inductor LF as schematically illustrated in FIG. 1, which is coupled with the galvanic isolation circuit 130 in order to form a resonant tank circuit with the associated parasitic capacitance of the corresponding parasitic capacitors CP1, CP2. A wide variety of different resonant tank circuits can be established, including series resonant tank circuits, parallel resonant tank circuits and/or combinations thereof. In this regard, the circuits 124 can include multiple inductors, and may include one or more capacitors in order to form a variety of different resonant circuits that combine with the series resonant operation of the galvanic isolation circuit 130 in order to provide a third or higher order overall filter network in the isolation circuit 120.

Figure 2:
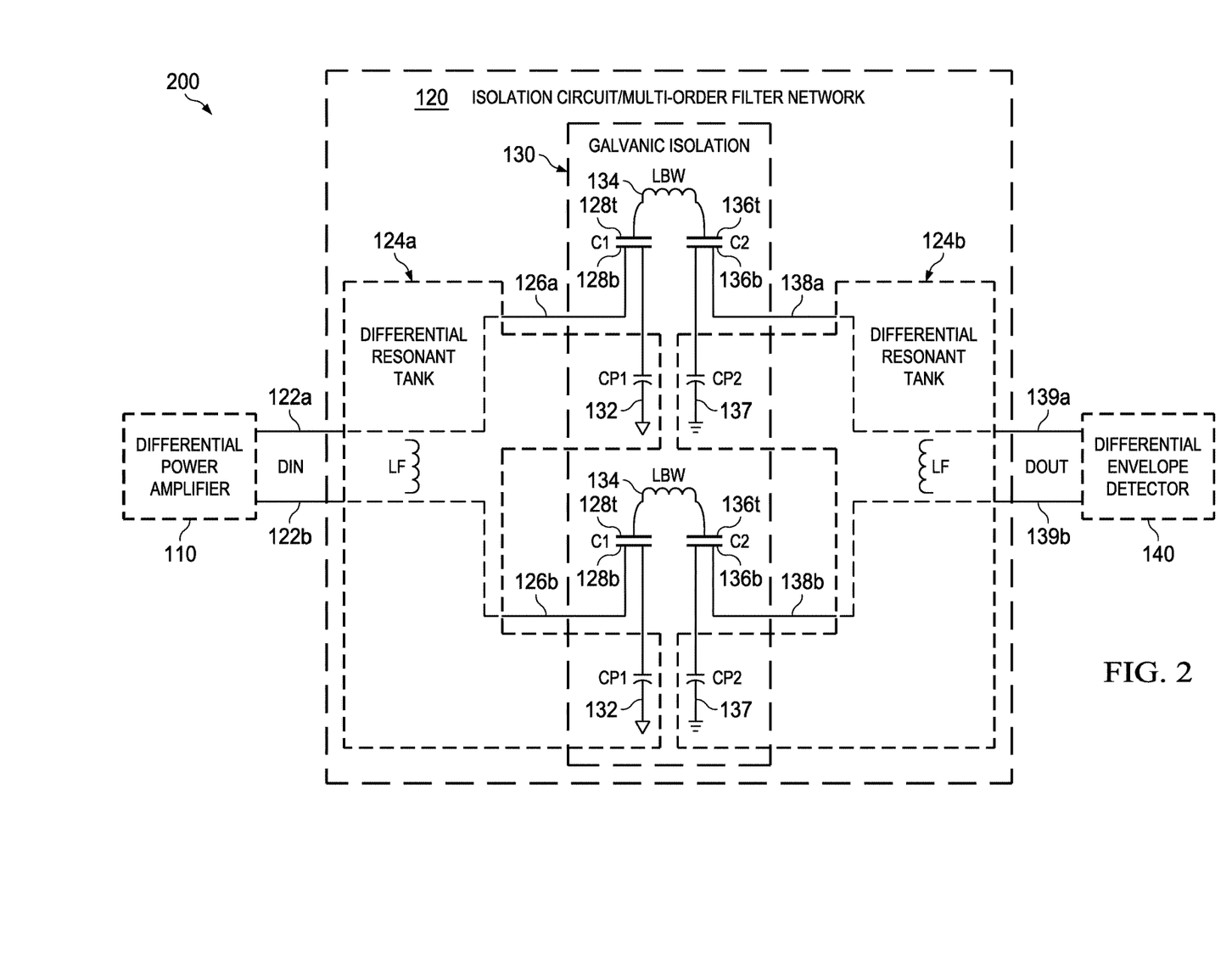
FIG. 2 is a schematic diagram of an example differential isolation circuit according to an embodiment.

The isolation circuit 120 includes a capacitive coupled galvanic isolation circuit 130 formed by the first and second coupling capacitor C1 and C2 and a bond wire 134. The example of FIG. 1 shows a single ended data path from the transmit circuit 102 to the receive circuit 115. Other embodiments are possible, for example, as shown in FIG. 2 below, in which a differential system is provided. The first coupling capacitor C1 in FIG. 1 includes a top or first plate 128t and a bottom or second plate 128b, where the plates 128 are separated by a dielectric material (not shown). In similar fashion, the second coupling capacitor C2 includes a top or first plate 136t and a bottom or second plate 136b separated by a dielectric material. In certain examples, the coupling capacitors are formed as structures on or in a corresponding semiconductor die or circuit chip, with the top plates 128t and 136t connected by a bond wire 134 with an inductance LBW. Any suitable wire bonding techniques can be used to form the connection, such as welding, soldering, etc. to connect a first end of the bond wire 134 to the plate 128t of C1, and to connect a second end to the plate 136t of the coupling capacitor C2. In this configuration, the coupling capacitor C1 and C2 and the bond wire 134 form a series resonant circuit between the bottom or second plates 128b, 136b of the coupling capacitor C1 and C2. Moreover, the series configuration (e.g., capacitive coupling or AC coupling) provides galvanic isolation in the circuit 130.

As seen in FIG. 1, the example first circuit 124a includes a first resonant tank input node 122 to receive an input data signal DIN from the transmit circuit 102. The first circuit 124a also includes a first resonant tank output node 126 connected to the second plate 128b of the first coupling capacitor C1. A first inductor LF of the first circuit 124a is coupled with the first resonant tank output node 126 to form a first resonant tank circuit with the first parasitic capacitor CP1. The second circuit 124b includes a second resonant tank input node 138 connected to the second plate 136b of the second coupling capacitor C2 and a second resonant tank output node 139 that provides the output data signal DOUT to the receive circuit 150. The second circuit 124b also includes a second inductor LF coupled with the second resonant tank input node 138 to form a second resonant tank circuit with a second parasitic capacitor CP2.

Referring also to FIG. 2, differential embodiments are possible, in which the first circuit 124a, the second circuit 124b and the capacitive coupled galvanic isolation circuit 130 are differential circuits. As shown in FIG. 2, two sets of capacitive coupled, wire bonded connected galvanic isolation circuits are provided for corresponding lines of a differential signal path between a differential power amplifier circuit 110 with resonant tank input nodes or lines 122a and 122b and a differential envelope detector circuit 140 and resonant tank output nodes or lines 139a and 139b. In this example, the first circuit 124a includes one or more inductors LF coupled with the bottom plates 128b of the associated coupling capacitors C1 to form a resonant tank circuit with the corresponding parasitic capacitor CP1. The second circuit 124b likewise includes one or more inductors LF coupled with the bottom plates 136b of the receive side coupling capacitors C2.

Figure 3:
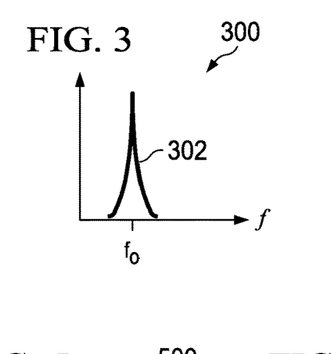
FIG. 3 is a graph showing frequency content of a transmit circuit carrier signal in the isolation module of FIG. 1.
Figure 4:
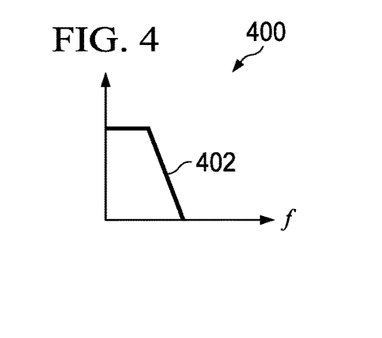
FIG. 4 is a graph showing frequency content of a modulated data signal in the transmit circuit of FIG. 1.
Figure 5:
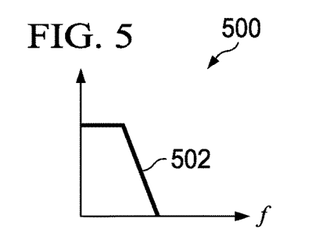
FIG. 5 is a graph showing frequency content of an envelope detector in a receive circuit of the isolation module in FIG. 1.
Figure 6:
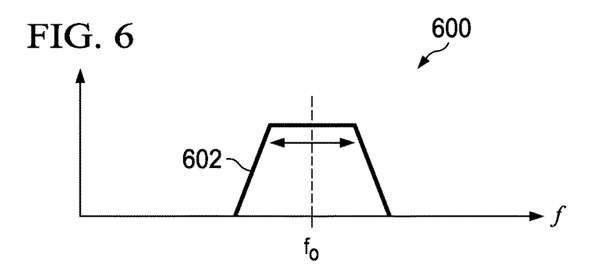
FIG. 6 is a graph showing an example bandpass filter frequency spectrum of the isolation circuit in FIG. 1.
Figure 7:
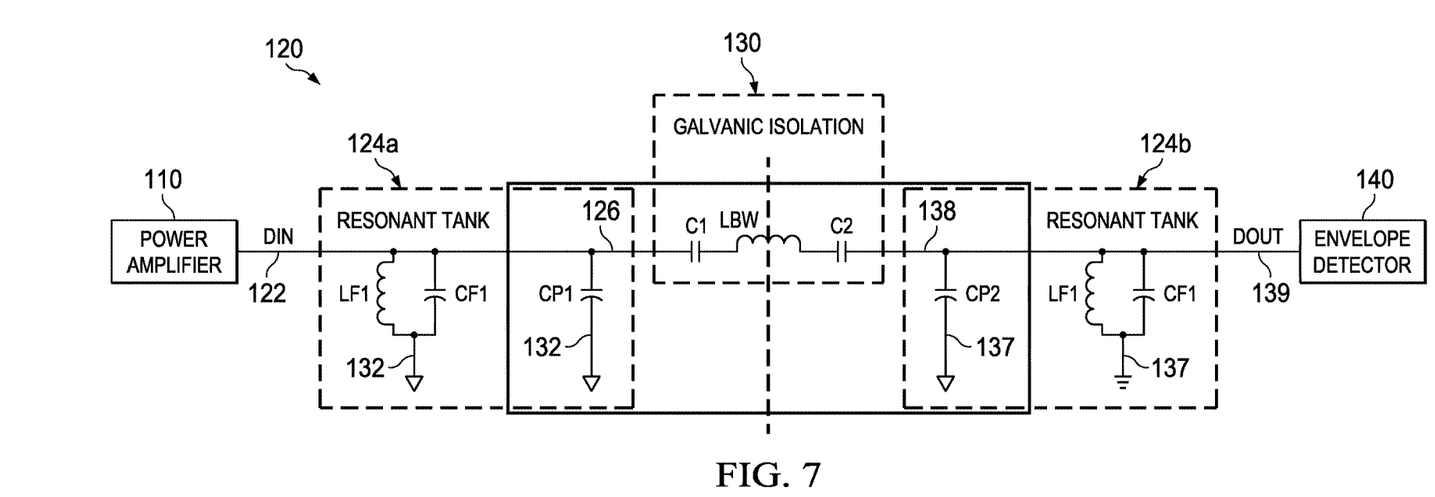
FIG. 7 is a schematic diagram of an example third order bandpass filter embodiment of an isolation circuit.

Referring now to FIGS. 1 and 3-7, a single ended third order bandpass filter network example is shown, implemented by the isolation circuit 120 described above. As seen in FIG. 7, the isolation circuit 120 in this example includes the coupling capacitors C1 and C2 and the inductance LBW of the bond wire 134 in the galvanic isolation circuit 130 as previously described. In addition, the first parasitic capacitor CP1 forms the first resonant tank circuit 124a with a first filter inductor LF1 and a first filter capacitor CF1. In this configuration, the first inductor LF1 is connected in parallel with the first parasitic capacitor CP1 to form the first resonant tank circuit as a first parallel resonant tank circuit. Similarly, the second circuit 124b in this example includes an inductor LF1 connected in parallel with the second parasitic capacitor CP2, and this embodiment includes a further filter capacitor CF1 also connected in parallel with LF1 and CP2 to form the second resonant tank circuit 124b as a second parallel resonant tank circuit. In this configuration, the isolation circuit 120 provides a third order bandpass filter network by the interconnection of the parallel resonant tank circuits 124 at the input and output of the series resonant circuit C1, LBW, C2 of the galvanic isolation circuit 130. FIG. 3 shows a graph 300 illustrating frequency content curve 302 of the sinusoidal carrier output signal provided by the isolator 116 of FIG. 1, which is primarily at an output frequency (e.g., the carrier frequency) $f_0$. A graph 400 in FIG. 4 shows a curve 402 representing the frequency response of the power amplifier circuit 110, which is primarily a low-pass filter-type response. Similarly, the graph 500 in FIG. 5 includes a curve 502 showing the generally low-pass frequency response of the envelope detector circuit 140.

The use of the first and second circuits 124a and 124b in conjunction with the series resonant filtering provided by the galvanic isolation circuit 130 in this example provides a composite overall bandpass frequency response curve 602 shown in the graph 600 of FIG. 6. Suitable design can provide the passband centered on any desired frequency. In one example, as seen in FIG. 6, the isolation circuit 120 is designed to provide a passband centered around the carrier frequency $f_0$ associated with the isolator 116 of the transmit circuit 102. It is noted that, for a given desired data rate, the circuits 124 and the galvanic isolation circuit 130 can be designed to provide a suitable passband for low-loss reliable transmission using any suitable carrier frequency $f_0$ to accommodate a desired transmission data rate associated with the transmit signal TX. This advantageously counteracts the signal attenuation problems previously associated with the parasitic capacitor CP1 and CP2. Moreover, the isolation circuit 120 and the overall isolation system 100 can provide cost-effective capacitive coupled isolation solutions for potentially very high data rates previously only addressed by more expensive and larger transformer and/or optical isolation approaches.

Figure 8:
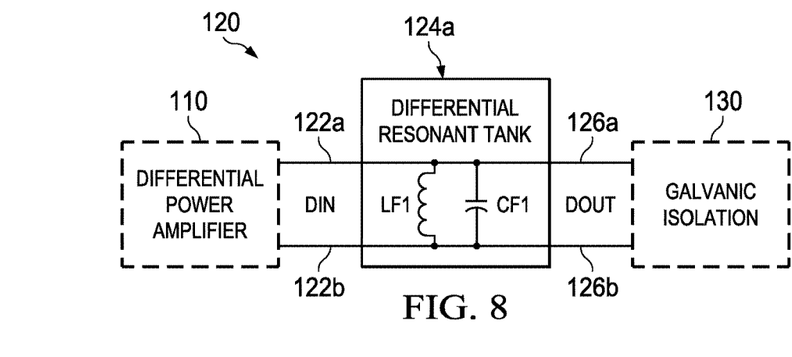
FIG. 8 is a schematic diagram of an example differential resonant tank circuit.

FIG. 8 illustrates another example of a differential first circuit 124a that includes a first inductor LF1 connected in parallel with a first filter capacitor CF1, both of which are connected between the input lines 122a and 122b, as well as the differential inputs 126a, 126b of a differential galvanic isolation circuit 130. In this case, the inductor LF1 is effectively connected in parallel with the corresponding parasitic capacitors CP1 of the galvanic isolation circuit 130, such that the resulting differential resonant tank circuit 124a provides a parallel resonant configuration. A similar differential second circuit 124b (not shown) can be provided on the output or receive side of the differential galvanic isolation circuit 130 to provide an overall third order bandpass filter network in the isolation circuit 120.

Figure 9:
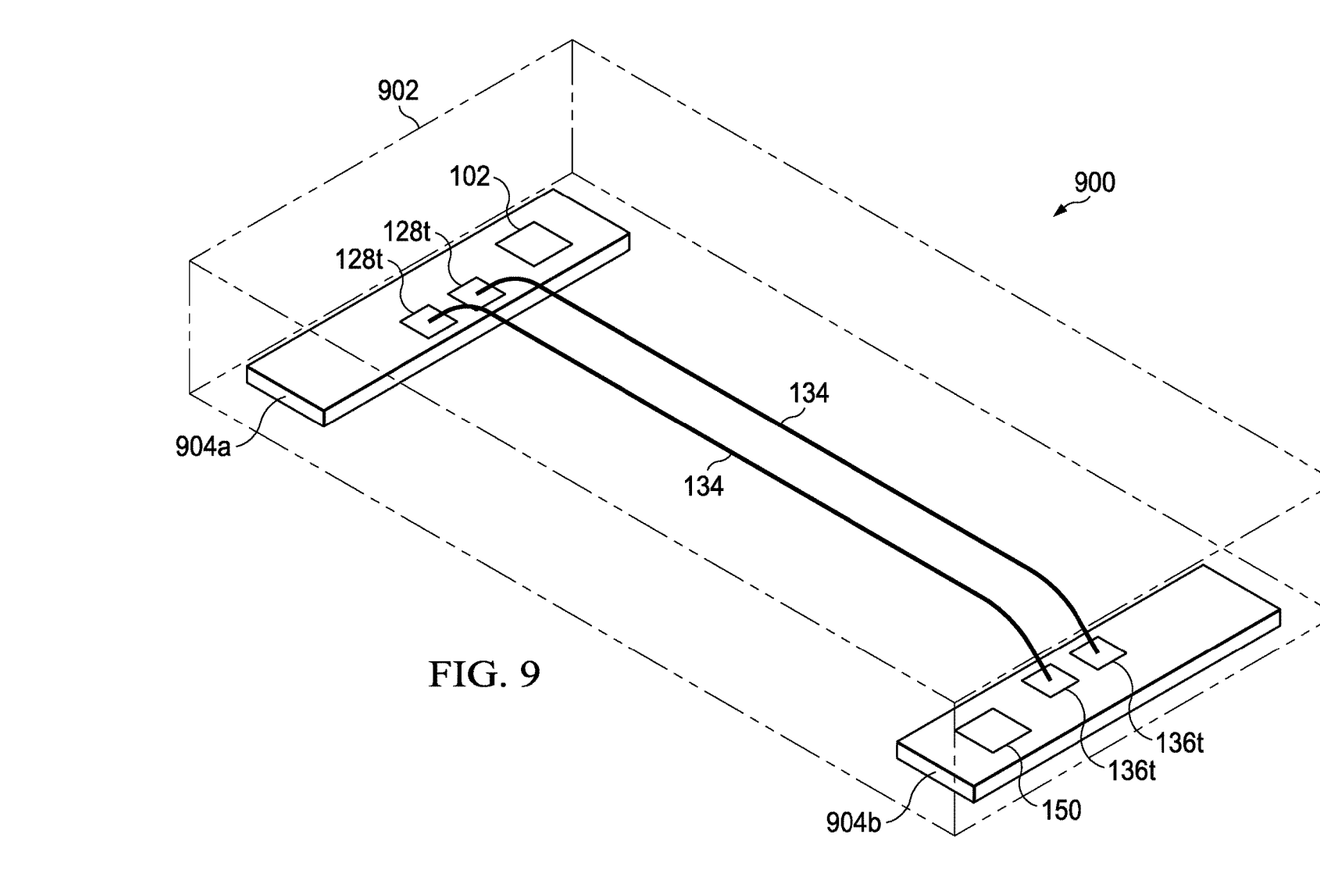
FIG. 9 is a perspective view of an example differential isolation module.

FIG. 9 illustrates a practical implementation of the isolation module. In this example, the module 160 as described above is implemented as a differential circuit, with a first semiconductor die or integrated circuit chip (IC) 904a and a second IC chip 904b. The first IC 904a includes the above-described transmit circuit 102, the first coupling capacitor C1 and the first circuit 124a. As seen in FIG. 9, moreover, the first or top plates 128t of the first coupling capacitors C1 are exposed at the top side of the first IC 904a to allow wire bonding via bond wires 134 for connection to the exposed top plates 136t of the second IC 904b. Moreover, the parasitic capacitors CP1 associated with the bottom plates of the first capacitors C1 are effectively part of the first IC 904a, and the second parasitic capacitors CP2 are part of the second IC 904b. In this implementation, therefore, the second IC 904b includes the receive circuit 150, the second coupling capacitor C2 and the second circuit 124b. In this regard, the inductors of the first and second circuits 124a, 124b can be fabricated on or in the associated ICs 904, or can be separate components in different embodiments. Similarly, any capacitors included in the circuits 124 can be formed on or in the associated ICs 904, or can be separate components electrically connected therewith.

Figure 10:
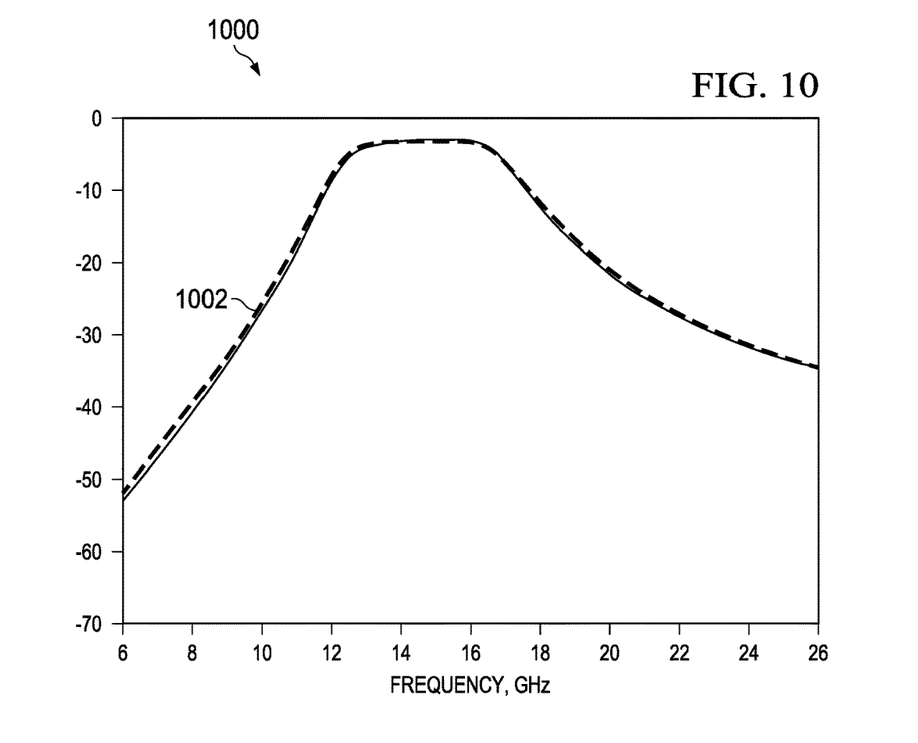
FIG. 10 is a graph of frequency performance for the third order bandpass filter isolation circuit of FIG. 7.

FIG. 10 includes a graph 1000 that shows a frequency response curve 1002 for an example differential bandpass implementation of the isolation circuit 120 implemented as shown in FIG. 9. In this example, the ICs 904 of FIG. 9 are spaced from one another by approximately 1.8 mm, and the bond wires 134 are gold material of approximately 24.3 μm. The structure is packaged in a molded compound 902, and includes suitable electrical connections to provide the transmit and receive terminals 162, 164 of FIG. 1 for interconnection to external circuitry (not shown). As shown in the graph 1000 of FIG. 10, this particular example provides a passband centered approximately at 14.5 GHz with suitable bandwidth and negligible passband attenuation (e.g., less than −5 DB) at 15.10 GHz. Any center frequency is possible (e.g., 1-200 GHz) based upon the bond-wire length and capacitance value. The bandpass filter network achieved using the galvanic isolation circuit 130 in combination with the first and second circuits 124 thus effectively eliminates the previous significant signal attenuation caused by the parasitic capacitor CP1 and CP2.

Referring now to FIGS. 11-14, further examples are possible using any suitable analog filter circuit configurations. The illustrated examples are not limiting, but merely a few possible implementations where the first circuit 124a, the capacitive coupled galvanic isolation circuit 130 and the second circuit 124b form a third or higher order bandpass filter that receives the input data signal DIN as an input and provides the output data signal DOUT as an output. The illustrated examples in FIGS. 11-14, moreover, provide single-ended circuit configurations, but differential implementations are also possible. Furthermore, although the illustrated examples provide overall bandpass filter structures, other filter types can be used. Furthermore, the filter details can be tailored to any specific application for design of the first and second circuits 124, which can have any type-approximation including: Maximally flat, Chebychev, Elliptic, Bessel, Linear phase, Gaussian, etc. in combination with the series resonant form of the AC coupled capacitor C1, C2 of the galvanic isolation circuit 130 in series with the inductance LBW of the bond wire 134.

Figure 11:
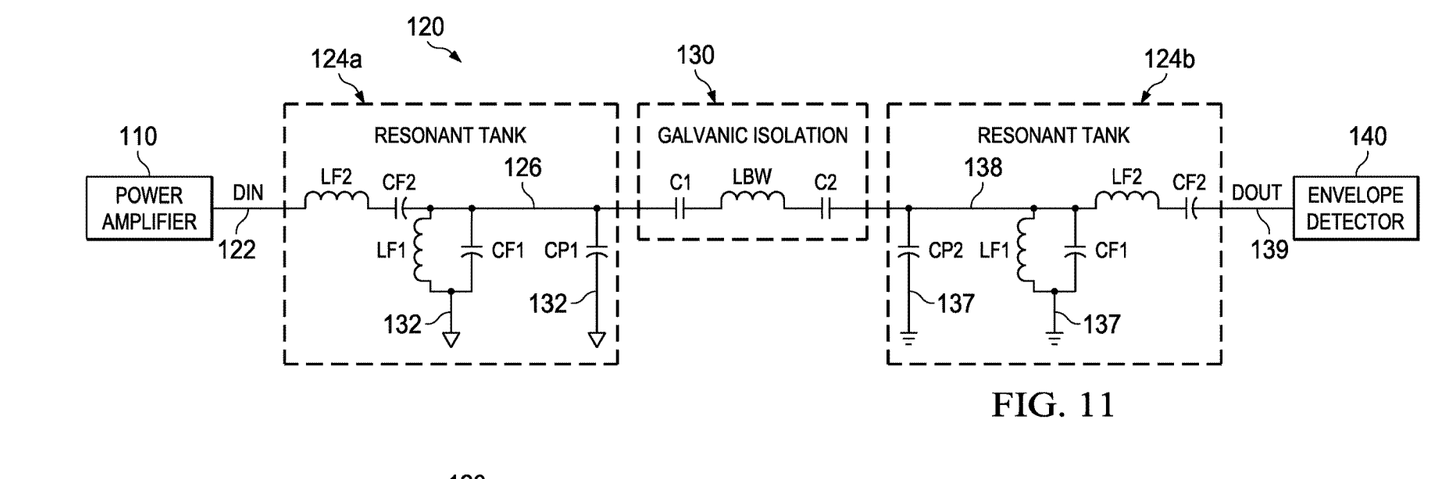
FIG. 11 is a schematic diagram of an example fifth order bandpass filter embodiment of an isolation circuit.

FIG. 11 shows an example single ended fifth order bandpass filter embodiment of an isolation circuit 120. As in FIG. 7, the first and second circuits 124a, 124b each include an inductor LF1 and filter capacitor CF1 in parallel with the associated parasitic capacitor CP of the galvanic isolation circuit 130. In FIG. 11, each of the first and second circuits 124a, 124b includes a second inductor LF2 connected in series with a second capacitor CF2. In each circuit 124, the inductor LF2 and the capacitor CF2 forms a series resonant circuit, and the circuits 124 combine this series resonant circuit with the parallel resonant circuit formed by the parasitic capacitance, the first inductor LF1 and the first capacitor CF1. In this example, the first circuit 124a includes a second capacitor CF2 and another inductor LF2 connected in series with one another between the first resonant tank input node 122 and the first resonant tank output node 126. The second circuit 124b includes a second capacitor CF2 and another inductor LF2 connected in series with one another between the second resonant tank input node 138 and the second resonant tank output node 139. In this configuration, each resulting resonant tank circuit 124 provides a two pole (second-order) system, and the combination of the two resonant tank circuits 124A, 124b and the series resonant circuit formed by the galvanic isolation circuit 130 provides a fifth order bandpass filter network which receives the input data signal DIN as an input and provides the output data signal DOUT as an output.

Differential versions of this or other fifth or higher order filter network are possible in other implementations.

Figure 12:
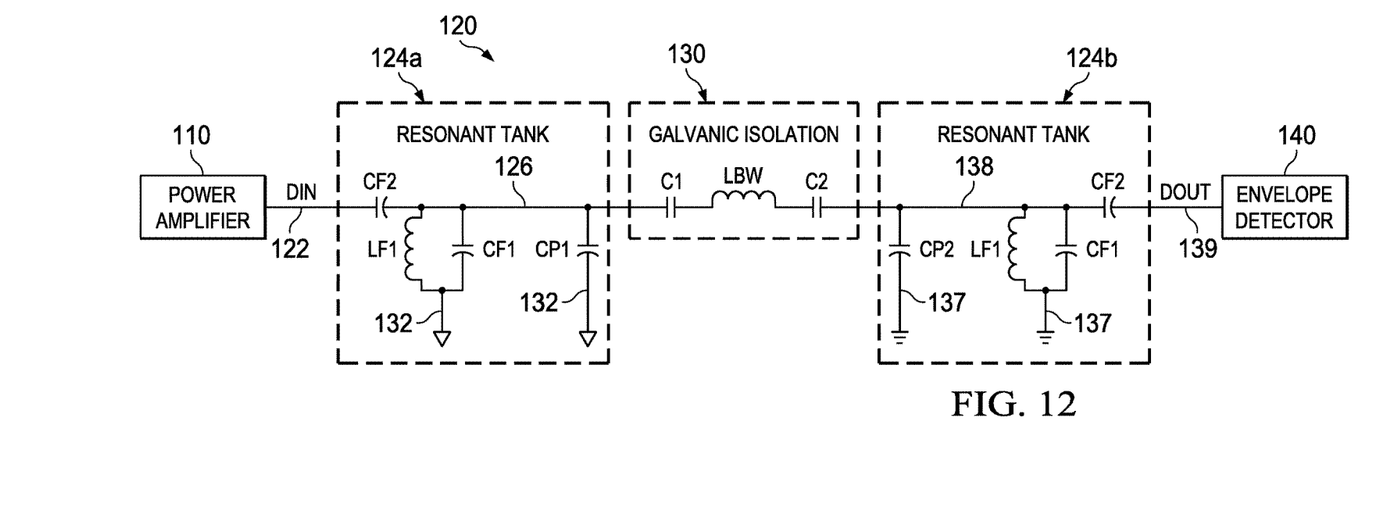
FIG. 12 is a schematic diagram of another bandpass filter embodiment of an isolation circuit.

FIG. 12 illustrates another single ended bandpass filter embodiment of an isolation circuit. In this example, the circuits 124 include a first capacitor CF1 connected in parallel with the inductor LF1 and the associated parasitic capacitor CP to form a parallel resonant circuit, and the circuits 124 further include a series-connected capacitor CF2. In particular, the first circuit 124a in FIG. 12 includes a second capacitor CF2 connected between the first resonant tank input node 122 and the first resonant tank output node 126, and the second circuit 124b includes a second capacitor CF2 connected between the second resonant tank input node 138 and the second resonant tank output node 139. Although this configuration in FIG. 12 is shown as a single ended implementation, other embodiments are possible using differential circuits 124, 130 with similar second or higher order resonant tank circuits 124.

Figure 13:
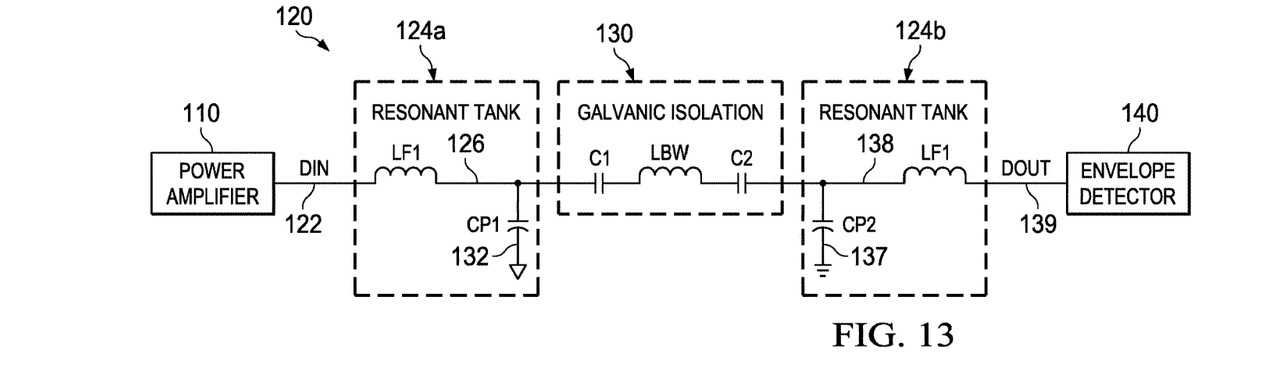
FIG. 13 is a schematic diagram of another bandpass filter embodiment of an isolation circuit.

FIG. 13 illustrates another example of a single ended bandpass filter embodiment using the galvanic isolation circuit 130 and first and second circuits 124A, 124b. This single-ended example includes a series-connected inductor LF1 connected between the resonant tank input node 122 and the first resonant tank output node 126 in the first resonant tank circuit 124a. The second resonant tank circuit 124b in FIG. 13 includes a single series-connected inductor LF1 connected between the second resonant tank input node 138 and the second resonant tank output node 139.

Figure 14:
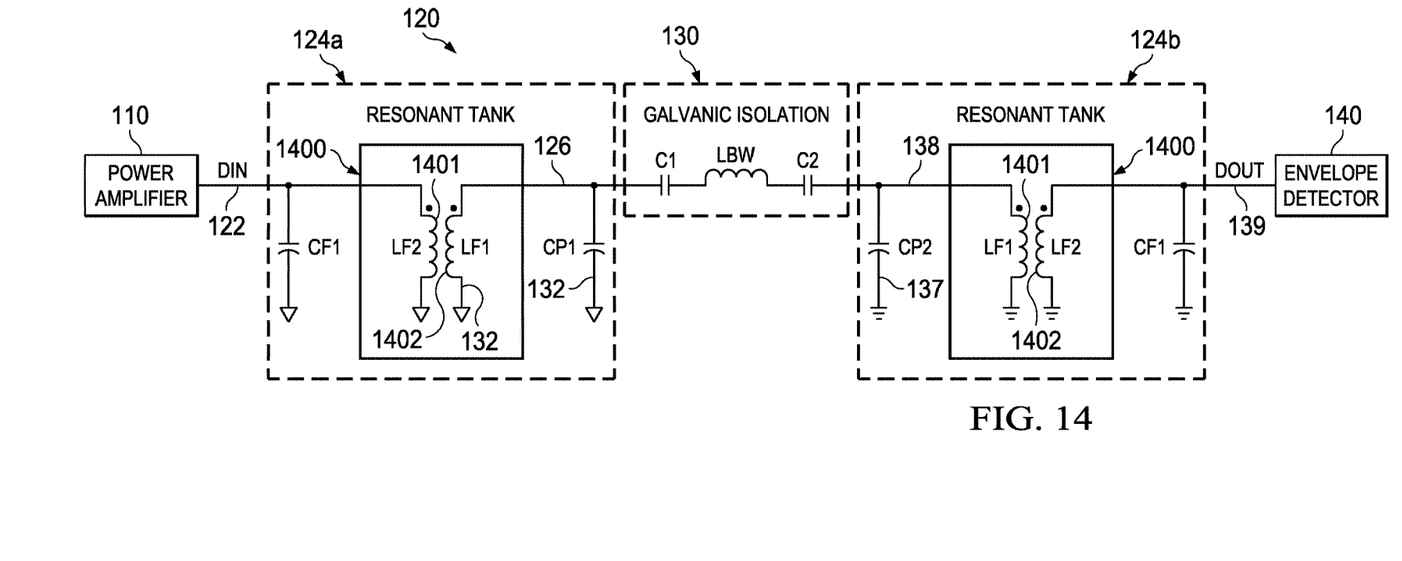
FIG. 14 is a schematic diagram of another bandpass filter isolation circuit embodiment using transformers.

FIG. 14 shows another bandpass filter isolation circuit embodiment using transformers in the individual resonant tank circuits 124. In this example, the circuits 124 individually include a transformer 1400 with a primary winding 1401 and a secondary winding 1402. In this example, the first circuit 124a includes a first transformer 1400 with a primary winding 1401 connected between the first resonant tank input node 122 and a ground reference. The first inductor LF1 of the first circuit 124a is a secondary winding 1402 of the first transformer 1400, which is connected between the first resonant tank output node 126 and the reference ground node 132 to form the first resonant tank circuit as a parallel resonant circuit with the first parasitic capacitor CP1. In this example, moreover, the second circuit 124b includes a second transformer 1400 with including a secondary winding 1402 connected between an output ground reference and the second resonant tank output node 139. In this example, moreover, the first inductor LF1 of the second circuit 124b is a primary winding 1401 of the second transformer 1400 connected between the second resonant tank input node 138 and the ground reference node 137 in parallel with the parasitic capacitor CP2 to form the second resonant tank circuit as a parallel resonant circuit. In certain implementations, the transformers 1400 and the coils thereof can be formed as metallic coil structures in different metallization layers of the corresponding IC chips 904 (FIG. 9), along with the capacitors CF to provide an integrated solution with connection between the IC chips 904a, 904b made through the bond wires 134.

Figure 15:
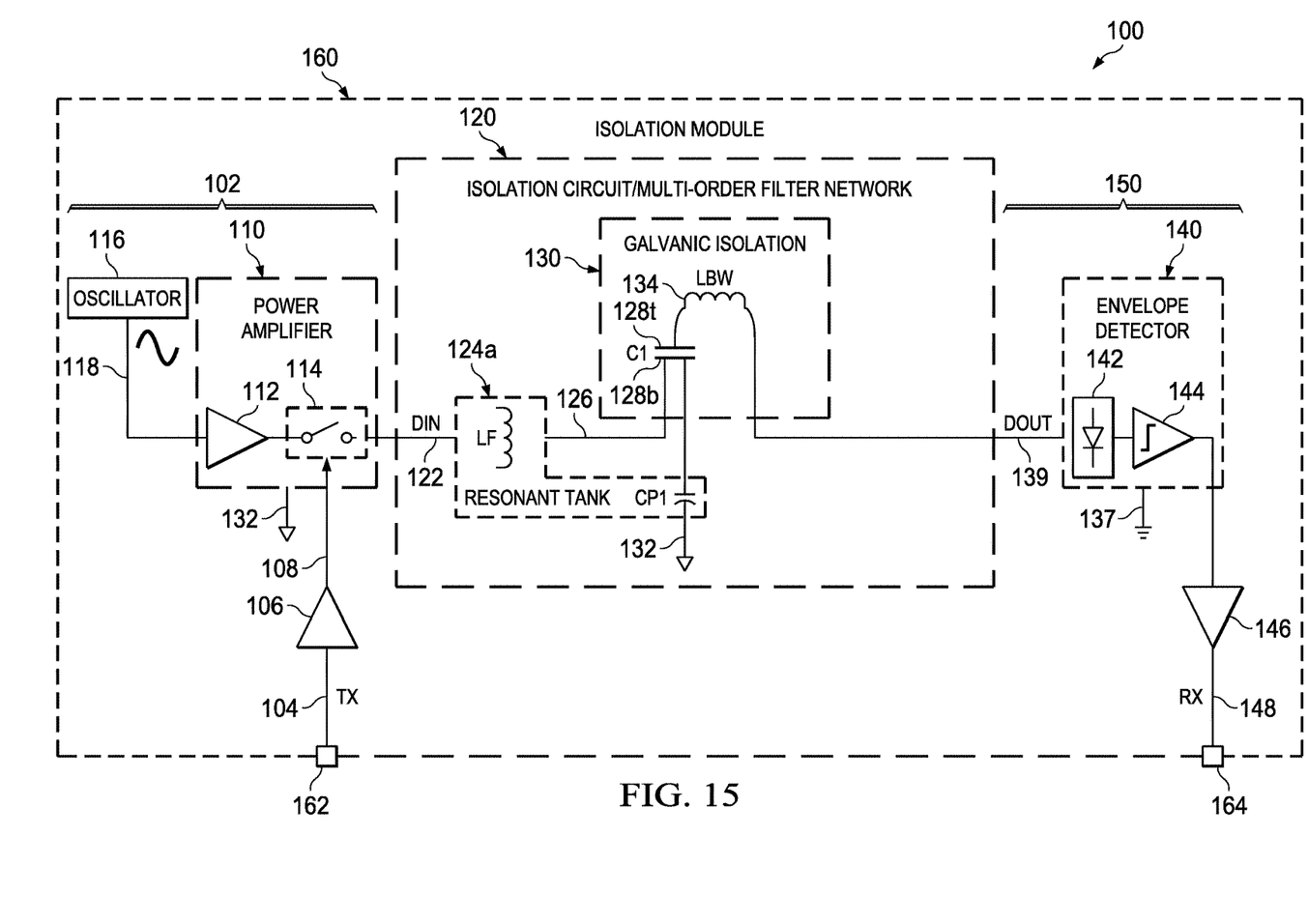
FIG. 15 is a schematic diagram of another isolation module with an isolation circuit including a single series-connected capacitor and a bond wire, with a single resonant tank circuit.
Figure 16:
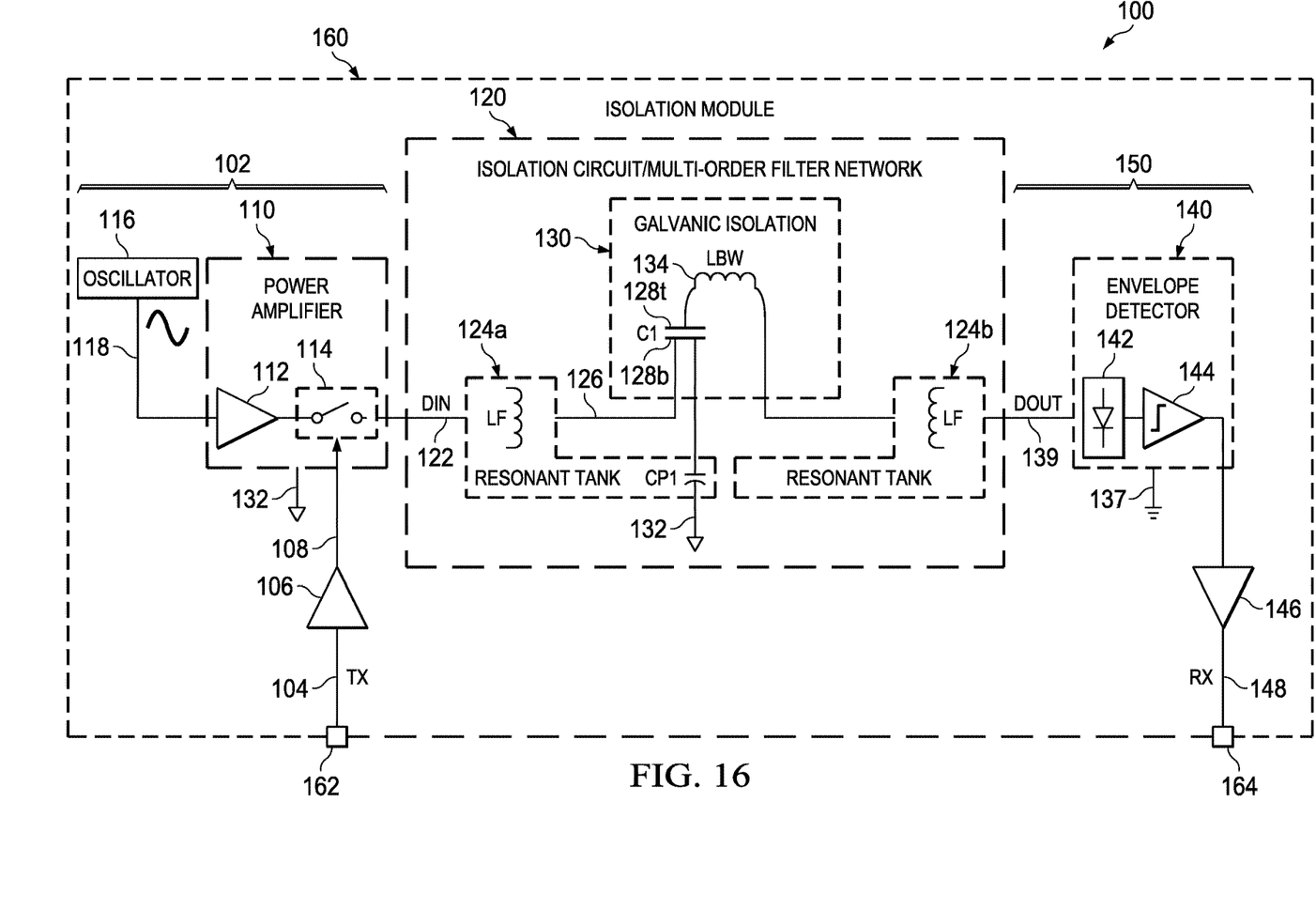
FIG. 16 is a schematic diagram of another isolation module with an isolation circuit including a single series-connected capacitor and a bond wire, as well as first and second resonant tank circuits.

Referring also to FIGS. 15 and 16, other possible embodiments are possible in which the isolation circuit 120 provides a galvanic isolation circuit 130 with a single series capacitor and one or two resonant tank circuit 124s, along with the bond wire 134. For example, the second capacitor C2 and the second resonant tank circuit 124b in FIG. 1 can be omitted as shown in the example of FIG. 15, with the bond wire 134 connected from the first plate 128t of the capacitor C1 to the envelope detector circuit 140 at node 139 in FIG. 1. In this example, the first coupling capacitor C1 and the bond wire 134 form a series resonant circuit between the second plate 128b of the first coupling capacitor C1 and the second end of the bond wire 134. The first circuit 124a in this example includes the first resonant tank input node 122 to receive the input data signal DIN, a first resonant tank output node 126 connected to the second plate 128b of the first coupling capacitor C1, and a first inductor LF coupled with the first resonant tank output node 126 to form a first resonant tank circuit with the first parasitic capacitor CP1 associated with the second plate 128b of the first coupling capacitor C1. FIG. 16 shows another possible implementation in which a second resonant tank circuit 124b is connected between the nodes 138 and 139, where the second resonant tank circuit 124p in certain implementations is substantially identical to the first resonant tank circuit 124a. Other equivalent implementations are possible in which the single series-connected capacitor is formed on the output side of the galvanic isolation circuit, with a bond wire connected to the power amplifier output at node 122 or to an output node 126 of an included resonant tank circuit 124a, and such implementations can use a single resonant tank circuit 124 or first and second tank circuits 124 as described above.

Figure 17:
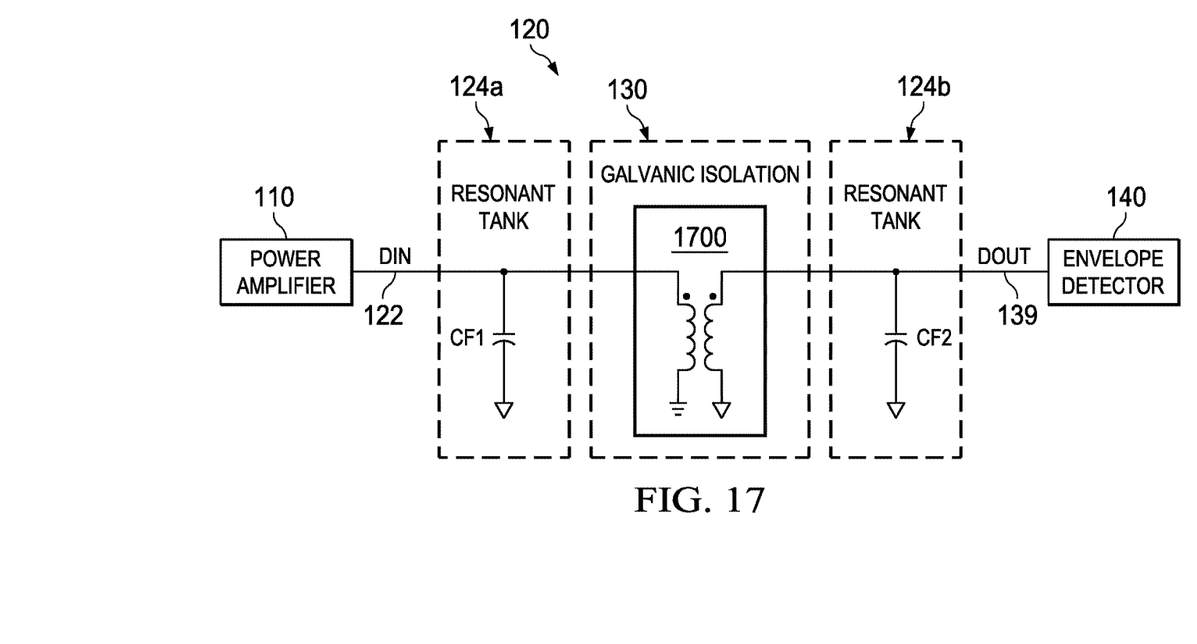
FIG. 17 is a schematic diagram of another isolation circuit embodiment including a galvanic isolation circuit formed by a transformer with a primary winding and a secondary windings, as well as resonant tank circuits on the primary and secondary sides of the galvanic isolation circuit.

FIG. 17 shows another possible isolation circuit example. In this case, the galvanic isolation circuit 130 includes a transformer 1700 with a primary winding and a secondary winding. First and second resonant tank circuits 124a and 124b are provided as described above, which form resonant circuits with the corresponding winding of the transformer 1700. Any suitable first or higher order circuits 124 can be used in combination with a transformer-based galvanic isolation circuit 130 in order to form an isolation circuit 120 and a corresponding multi-order filter network.

As seen above, the disclosed examples provide isolation circuitry with particular utility in digital isolator applications or other situations in which a time varying signal is to be conveyed across an isolation barrier using capacitive coupling. These examples provide enhanced control over bandwidth and resulting data rate, as well as allowing particular tailoring of filter performance for any desired end use environment. The disclosed examples advantageously avoid or mitigate the extra cost and circuit size penalties associated with transformer isolation solutions, and incur no EMI penalties. Moreover, the enhanced control over the passband allows high data rate usage of capacitive coupling isolation without the cost penalties associated with optical isolation techniques. In addition, the advantageous use of the circuits 124 tailors the filter characteristics in view of the potentially large parasitic capacitance associated with the coupling capacitors, allowing use of integrated circuit fabrication techniques to construct the capacitors in conjunction with wire bonding connection techniques to provide isolation systems at relatively low cost. In particular, disclosed examples can be used for data isolators with greatly enhanced data rates, for example from Mb per second up to tens of Gb per second, with the ability to control the center frequency and bandwidth of a passband for the above described bandpass filter examples.

These concepts can be used in any filtering application beyond the digital isolator examples described above. In particular, the disclosed examples provide low-loss, multi-order bandpass filter circuit 120 with a first filter circuit provided by the circuit 124a. The first filter circuit 124a includes a first resonant tank input node 122 to receive an input data signal DIN, a first resonant tank output node 126, and a first inductor LF coupled with the first resonant tank output node 126. The circuit 124a can include one or more capacitors and additional inductors in various configurations as described above. The filter network also includes a first coupling capacitor C1 with a first plate 128t and a second plate 128b connected to the first resonant tank output node 126. The first inductor LF forms a first resonant tank circuit with a first parasitic capacitor CP1 associated with the second plate 128b of the first coupling capacitor C1. The filter network also includes a second coupling capacitor C2 with a first plate 136t and a second plate 136b, as well as a second filter circuit 124b. The second filter circuit 124B includes a second resonant tank input node 138 connected to the second plate 136b of the second coupling capacitor C2, a second resonant tank output node 139 to provide an output data signal DOUT, and a second inductor LF coupled with the second resonant tank input node 138 to form a second resonant tank circuit with a second parasitic capacitor CP2 associated with the second plate 136b of the second coupling capacitor C2. In addition, a bond wire 134 connects the first plate 128t of the first coupling capacitor C1 with the first plate 136t of the second coupling capacitor C2 to form a capacitive coupled galvanic isolation barrier between the first filter circuit 124a and the second filter circuit 124b.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An isolation circuit to convey a data signal across a galvanic isolation barrier, comprising:
    a capacitive coupled galvanic isolation circuit, comprising:
        a first coupling capacitor, including a first plate and a second plate;
        a second coupling capacitor, including a first plate and a second plate; and
        a bond wire, including a first end connected to the first plate of the first coupling capacitor, and a second end connected to the first plate of the second coupling capacitor,
        the first coupling capacitor, the second capacitor and the bond wire forming a series resonant circuit between the second plate of the first coupling capacitor and the second plate of the second coupling capacitor;
    a first circuit, including a first resonant tank input node to receive an input data signal, a first resonant tank output node connected to the second plate of the first coupling capacitor, and a first inductor coupled with the first resonant tank output node to form a first resonant tank circuit with a first parasitic capacitor associated with the second plate of the first coupling capacitor; and
    a second circuit, including a second resonant tank input node connected to the second plate of the second coupling capacitor, a second resonant tank output node to provide an output data signal, and a second inductor coupled with the second resonant tank input node to form a second resonant tank circuit with a second parasitic capacitor associated with the second plate of the second coupling capacitor.

2. The isolation circuit of claim 1, wherein the second circuit is substantially identical to the first circuit.

3. The isolation circuit of claim 1,
    wherein the first inductor is connected in parallel with the first parasitic capacitor to form the first resonant tank circuit as a first parallel resonant tank circuit;
    wherein the second inductor is connected in parallel with the second parasitic capacitor to form the second resonant tank circuit as a second parallel resonant tank circuit; and
    wherein the first circuit, the capacitive coupled galvanic isolation circuit and the second circuit form a third or higher order bandpass filter that receives the input data signal as an input and provides the output data signal as an output.

4. The isolation circuit of claim 3, wherein the first circuit includes a capacitor connected to the first inductor, and wherein the second circuit includes a capacitor connected to the second inductor.

5. The isolation circuit of claim 4, wherein the first circuit, the second circuit and the capacitive coupled galvanic isolation circuit are differential circuits.

6. The isolation circuit of claim 4,
wherein the first circuit includes a first transformer, including a primary winding connected to the first resonant tank input node in parallel with the capacitor of the first circuit, and wherein the first inductor of the first circuit is a secondary winding of the first transformer connected to the first resonant tank output node to form the first resonant tank circuit with the first parasitic capacitor; and
wherein the second circuit includes a second transformer, including a secondary winding connected to the second resonant tank output node in parallel with the capacitor of the second circuit, and wherein the first inductor of the second circuit is a primary winding of the second transformer connected to the second resonant tank input node to form the second resonant tank circuit with the second parasitic capacitor.

7. The isolation circuit of claim 4, wherein the capacitor of the first circuit is connected in parallel with the first parasitic capacitor, and wherein the capacitor of the second circuit is connected in parallel with the second parasitic capacitor.

8. The isolation circuit of claim 7, wherein the first circuit includes a second capacitor and another inductor connected in series with one another between the first resonant tank input node and the first resonant tank output node, wherein the second circuit includes a second capacitor and another inductor connected in series with one another between the second resonant tank input node and the second resonant tank output node, and wherein the first circuit, the capacitive coupled galvanic isolation circuit and the second circuit form a fifth or higher order bandpass filter that receives the input data signal as an input and provides the output data signal as an output.

9. The isolation circuit of claim 7, wherein the first circuit includes a second capacitor connected between the first resonant tank input node and the first resonant tank output node, and wherein the second circuit includes a second capacitor connected between the second resonant tank input node and the second resonant tank output node.

10. The isolation circuit of claim 1,
wherein the first inductor is connected in series with the first parasitic capacitor to form the first resonant tank circuit as a first series resonant tank circuit;
wherein the second inductor is connected in parallel with the second parasitic capacitor to form the second resonant tank circuit as a second series resonant tank circuit; and
wherein the first circuit, the capacitive coupled galvanic isolation circuit and the second circuit form a third or higher order bandpass filter that receives the input data signal as an input and provides the output data signal as an output.

11. The isolation circuit of claim 1, wherein the first circuit, the second circuit and the capacitive coupled galvanic isolation circuit are differential circuits.

12. The isolation circuit of claim 1,
wherein the first circuit includes a first transformer, including a primary winding connected to the first resonant tank input node, and wherein the first inductor of the first circuit is a secondary winding of the first transformer connected to the first resonant tank output node to form the first resonant tank circuit with the first parasitic capacitor; and
wherein the second circuit includes a second transformer, including a secondary winding connected to the second resonant tank output node, and wherein the first inductor of the second circuit is a primary winding of the second transformer connected to the second resonant tank input node to form the second resonant tank circuit with the second parasitic capacitor.

13. An isolation module, comprising:
a transmit circuit, including an input to receive a transmit signal;
a receive circuit, including an output to provide a receive signal; and
an isolation circuit to convey a data signal from the transmit circuit to the receive circuit across a galvanic isolation barrier, comprising:
a capacitive coupled galvanic isolation circuit, comprising:
a first coupling capacitor, including a first plate and a second plate;
a second coupling capacitor, including a first plate and a second plate; and
a bond wire, including a first end connected to the first plate of the first coupling capacitor, and a second end connected to the first plate of the second coupling capacitor,
the first coupling capacitor, the second capacitor and the bond wire forming a series resonant circuit between the second plate of the first coupling capacitor and the second plate of the second coupling capacitor,
a first circuit, including a first resonant tank input node to receive an input data signal from the transmit circuit, a first resonant tank output node connected to the second plate of the first coupling capacitor, and a first inductor coupled with the first resonant tank output node to form a first resonant tank circuit with a first parasitic capacitor associated with the second plate of the first coupling capacitor, and
a second circuit, including a second resonant tank input node connected to the second plate of the second coupling capacitor, a second resonant tank output node to provide an output data signal to the receive circuit, and a second inductor coupled with the second resonant tank input node to form a second resonant tank circuit with a second parasitic capacitor associated with the second plate of the second coupling capacitor.

14. The isolation module of claim 13, comprising:
a first integrated circuit including the transmit circuit, the first coupling capacitor and the first circuit; and
a second integrated circuit including the receive circuit, the second coupling capacitor and the second circuit.

15. The isolation module of claim 13, wherein the first circuit, the second circuit and the capacitive coupled galvanic isolation circuit are differential circuits.

16. The isolation module of claim 13,
wherein the first circuit includes a first transformer, including a primary winding connected to the first resonant tank input node, and wherein the first inductor of the first circuit is a secondary winding of the first transformer connected to the first resonant tank output node to form the first resonant tank circuit with the first parasitic capacitor; and
wherein the second circuit includes a second transformer, including a secondary winding connected to the second resonant tank output node, and wherein the first inductor of the second circuit is a primary winding of the second transformer connected to the second resonant tank input node to form the second resonant tank circuit with the second parasitic capacitor.

17. The isolation module of claim 13,
wherein the first inductor is connected in parallel with the first parasitic capacitor to form the first resonant tank circuit as a first parallel resonant tank circuit;
wherein the second inductor is connected in parallel with the second parasitic capacitor to form the second resonant tank circuit as a second parallel resonant tank circuit; and
wherein the first circuit, the capacitive coupled galvanic isolation circuit and the second circuit form a third or higher order bandpass filter that receives the input data signal as an input and provides the output data signal as an output.

18. The isolation module of claim 17, wherein the first circuit includes a capacitor connected to the first inductor, and wherein the second circuit includes a capacitor connected to the second inductor.

19. The isolation module of claim 13,
wherein the first inductor is connected in series with the first parasitic capacitor to form the first resonant tank circuit as a first series resonant tank circuit;
wherein the second inductor is connected in parallel with the second parasitic capacitor to form the second resonant tank circuit as a second series resonant tank circuit; and
wherein the first circuit, the capacitive coupled galvanic isolation circuit and the second circuit form a third or higher order bandpass filter that receives the input data signal as an input and provides the output data signal as an output.

20. A low-loss, multi-order bandpass filter circuit, comprising:
a first filter circuit, including a first resonant tank input node to receive an input data signal, a first resonant tank output node, and a first inductor coupled with the first resonant tank output node;
a first coupling capacitor, including a first plate and a second plate connected to the first resonant tank output node, the first inductor forming a first resonant tank circuit with a first parasitic capacitor associated with the second plate of the first coupling capacitor;
a second coupling capacitor, including a first plate and a second plate;
a second filter circuit, including a second resonant tank input node connected to the second plate of the second coupling capacitor, a second resonant tank output node to provide an output data signal, and a second inductor coupled with the second resonant tank input node to form a second resonant tank circuit with a second parasitic capacitor associated with the second plate of the second coupling capacitor; and
a bond wire connected between the first plate of the first coupling capacitor and the first plate of the second coupling capacitor to form a capacitive coupled galvanic isolation barrier between the first filter circuit and the second filter circuit.

21. An isolation circuit to convey a data signal across a galvanic isolation barrier, comprising:
a capacitive coupled galvanic isolation circuit, comprising a first coupling capacitor, including a first plate and a second plate, and a bond wire, including a first end connected to the first plate of the first coupling capacitor, and a second end, the first coupling capacitor and the bond wire forming a series resonant circuit between the second plate of the first coupling capacitor and the second end of the bond wire; and
a first circuit, including a first resonant tank input node to receive an input data signal, a first resonant tank output node connected to the second plate of the first coupling capacitor, and a first inductor coupled with the first resonant tank output node to form a first resonant tank circuit with a first parasitic capacitor associated with the second plate of the first coupling capacitor.

* * * * *